United States Patent
Kim et al.

(10) Patent No.: US 6,888,412 B2
(45) Date of Patent: May 3, 2005

(54) PHASE LOCKED LOOP CIRCUIT FOR REDUCING ELECTROMAGNETIC INTERFERENCE AND CONTROL METHOD THEREOF

(75) Inventors: Sang-Young Kim, Kyungki-do (KR); Pil-Jae Jun, Kyungki-do (KR)

(73) Assignee: Samsung Electronics Co., Ltd., Kyungki-Do (KR)

( * ) Notice: Subject to any disclaimer, the term of this patent is extended or adjusted under 35 U.S.C. 154(b) by 64 days.

(21) Appl. No.: 10/183,423

(22) Filed: Jun. 28, 2002

(65) Prior Publication Data

US 2004/0001600 A1 Jan. 1, 2004

(30) Foreign Application Priority Data

Jun. 28, 2001 (KR) ........................................ 2001-37632

(51) Int. Cl.[7] .............................. H03B 1/00; H03L 7/00; H03L 7/06
(52) U.S. Cl. .......................... 331/1 A; 331/74; 327/145; 327/147
(58) Field of Search ............................ 331/1 A, 45, 74, 331/199; 327/145–147, 151, 152, 160, 162, 291, 292, 295

(56) References Cited

U.S. PATENT DOCUMENTS

| | | | | |
|---|---|---|---|---|
| 4,963,839 A | * | 10/1990 | Stacey | 331/17 |
| 5,731,743 A | * | 3/1998 | Sauer | 331/57 |
| 5,877,641 A | * | 3/1999 | Ziegler et al. | 327/156 |
| 6,114,914 A | * | 9/2000 | Mar | 331/16 |
| 6,177,844 B1 | * | 1/2001 | Sung et al. | 331/25 |
| 6,369,661 B1 | * | 4/2002 | Scott et al. | 331/45 |

* cited by examiner

*Primary Examiner*—Timothy P. Callahan
*Assistant Examiner*—An T. Luu
(74) *Attorney, Agent, or Firm*—Harness, Dickey & Pierce, P.L.C.

(57) ABSTRACT

For a phase-locked loop, disclosed is a method (and corresponding apparatus) for reducing electromagnetic interference caused by a clock signal produced by a voltage controlled oscillator, the method comprising: generating a control signal having a first type, e.g., sinusoidal, of slight variation in magnitude relative to a nominal magnitude value thereof; and providing the slightly varying control signal to a voltage-controlled oscillator ("VCO") to obtain a clock signal exhibiting a second type, e.g., sinusoidal, of slight variation in frequency relative to a nominal frequency value thereof. The slight variation is non-negligible.

23 Claims, 8 Drawing Sheets

PHASE LOCKED LOOP CIRCUIT FOR REDUCING ELECTROMAGNETIC INTERFERENCE AND CONTROL METHOD THEREOF

FIELD OF THE INVENTION

The present invention relates to a phase locked loop (PLL) circuit, and more particularly, to a PLL circuit for reducing electromagnetic interference (EMI) in a high speed system and a control method thereof.

BACKGROUND OF THE INVENTION

Computer speeds continue to become faster. A fast clock signal is required for fast data processing. Harmonic components are exhibited by a high speed clock signal. Electromagnetic interference (EMI), which is harmful to the human body, is generated by the harmonic components. EMI in a system has been reduced by shielding or using capacitance. However, there are limitations on reducing EMI in a system by shielding or using capacitance.

Figure 9:
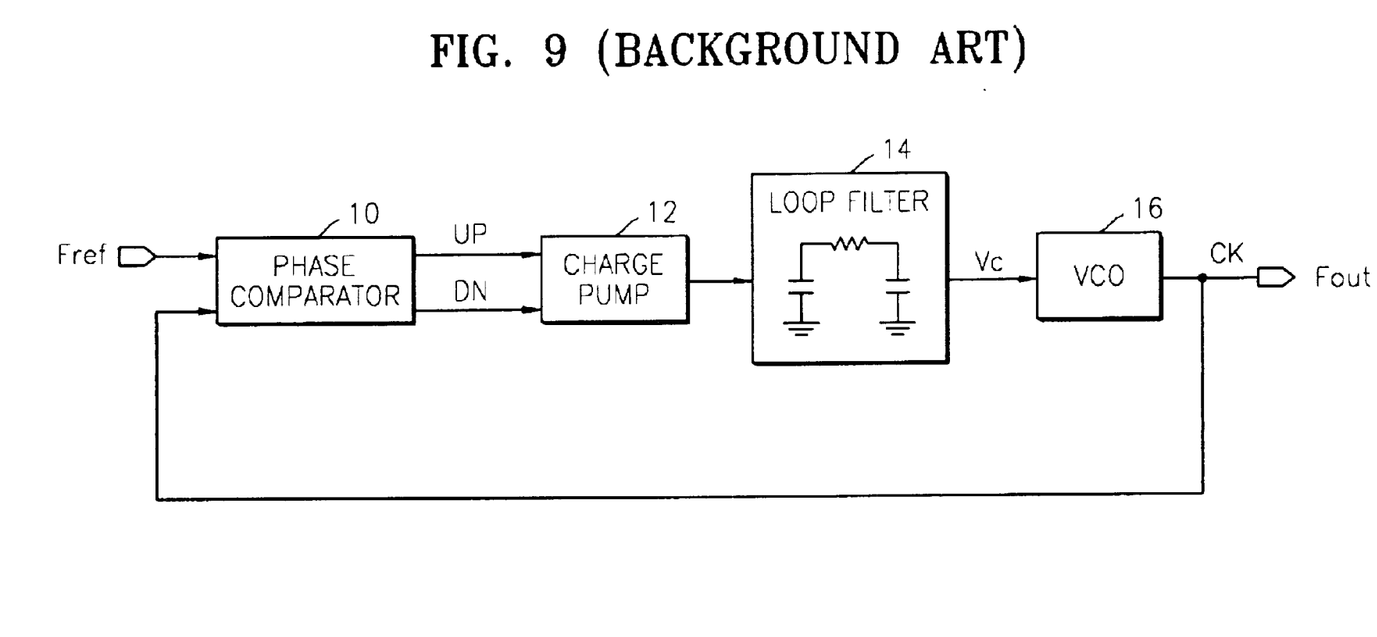
FIG. 9 is a block diagram schematically illustrating a phase locked loop (PLL) according to the Background Art.

Most of the EMI in a computer system is generated in a clock generating portion that generates the high speed clock signal. In other words, EMI is generated in a high speed clock signal due to harmonics. Recently, techniques for reducing EMI by lowering the energy level of harmonics have been developed. In general, a phase locked loop (PLL) is used to generate a clock signal, and the PLL generates a modulated clock signal, which is known as a spread spectrum signal, to reduce the energy level of harmonics contained in the clock signal. FIG. 9 is a block diagram schematically illustrating a PLL according to the Background Art.

As described above, a method for generating a modulated clock signal in a PLL circuit includes a phase modulation method and a frequency modulation method. A Sigma Delta method is used as the phase modulation method. The Sigma Delta method is a technique which reduces the energy level of EMI by modulating the phase difference between a reference input frequency and a feedback frequency by using a sigma delta modulating block that finely controls current via a charge pump block in the PLL. The frequency modulation method is a technique which reduces the energy level of EMI by utilizing the phase lock range of the PLL circuit via a multiple counter or read-only memory (ROM) used to feed back a frequency generated by a voltage-controlled oscillator (VCO) in the PLL circuit.

However, each of the spread spectrum clock signal generators using the Sigma Delta modulation method or the frequency modulation method is designed to reduce the energy level of a certain frequency and each has a problem that variation in its characteristics can be large. Furthermore, since the size of physical data is large and it is difficult to adjust timing between peripheral blocks when controlling the PLL circuit, malfunction in the PLL circuit can easily occur.

SUMMARY OF THE INVENTION

The invention, in part according to an embodiment of the invention, the invention, also in part according to an embodiment of the invention, provides A phase locked loop (PLL) circuit for reducing electromagnetic interference (EMI) including a phase comparator for comparing the phase of an externally input reference clock signal with the phase of a feedback signal to output an up or a down signal according to the compared result, a charge pump for generating a charge signal for supplying or sinking charges in response to the up or down signal, and a loop filter for low-pass filtering the charge signal to generate direct current (DC) control voltage, the PLL circuit comprising: a voltage-controlled oscillator (VCO) for generating an output clock signal oscillated into an oscillating frequency corresponding to the control voltage; a multiphase interpolater for generating first through n-th shifted signals, which have a predetermined offset so as not to overlap one another, by using the output clock signal; and a feedback signal portion for receiving the up/down signal to determine whether the feedback signal is locked to the reference clock signal, for outputting the output clock signal as the feedback clock signal before the feedback signal is locked to the reference clock signal, and for sequentially selecting one of the first through n-th shifted clock signals to be the feedback clock signal once the feedback clock signal is locked to the reference clock signal.

The invention, also in part according to an embodiment of the invention, provides a method of controlling a phase locked loop (PLL) circuit for reducing electromagnetic interference (EMI) including a phase comparator for comparing the phase of an externally input reference clock signal with the phase of a feedback clock signal to output an up or a down signal according to the compared result, a charge pump for generating a charge signal for supplying or sinking charges in response to the up or down signal, a loop filter for low-pass filtering the charge signal to generate direct current (DC) control voltage, and a voltage-controlled oscillator (VCO) for generating an output clock signal having an oscillating frequency corresponding to the control voltage, the method comprising: (a) generating first through n-th shifted signals, which have a predetermined offset so as not to overlap one another, by using the clock signal; (b) determining, according to the up/down count, whether the phase locked loop (PLL) circuit is locked; (c) selecting one of said shifted signals having the same phase as that of the clock signal and providing the selected signal to the phase comparator until it is determined that the PLL circuit is locked in the step (b); and (d) sequentially selecting one from among the first through n-th shifted clock signals to be the feedback signal once it is determined that the PLL circuit is locked in the step (b).

The invention, also in part according to an embodiment of the invention, provides (in a phase-locked loop) a method of reducing electromagnetic interference caused by a clock signal produced by a voltage controlled oscillator, the method comprising: generating a control signal having a first type, e.g., sinusoidal, of slight variation in magnitude relative to a nominal magnitude value thereof; and providing the slightly varying control signal to a voltage-controlled oscillator ("VCO") to obtain a clock signal exhibiting a second type, e.g., sinusoidal, of slight variation in frequency relative to a nominal frequency value thereof.

The invention, also in part according to an embodiment of the invention, provides In a phase-locked loop, an apparatus for reducing electromagnetic interference caused by a clock signal produced by a voltage controlled oscillator, the apparatus comprising: generating means for generating a control signal having a first type, e.g., sinusoidal, of slight variation in magnitude relative to a nominal magnitude relative to a nominal magnitude value thereof; and voltage-controlled oscillator ("VCO") means for generating a clock signal exhibiting a second type, e.g., sinusoidal, of slight variation in frequency relative to a nominal frequency value thereof based upon the slightly varying control signal output by said generating means.

BRIEF DESCRIPTION OF THE DRAWINGS

The above objects and advantages of the present invention will become more apparent by describing in detail a preferred embodiment thereof with reference to the attached drawings in which.

DETAILED DESCRIPTION OF THE INVENTION

Hereinafter, the present invention will be described in detail with reference to the accompanying drawings.

Figure 1:
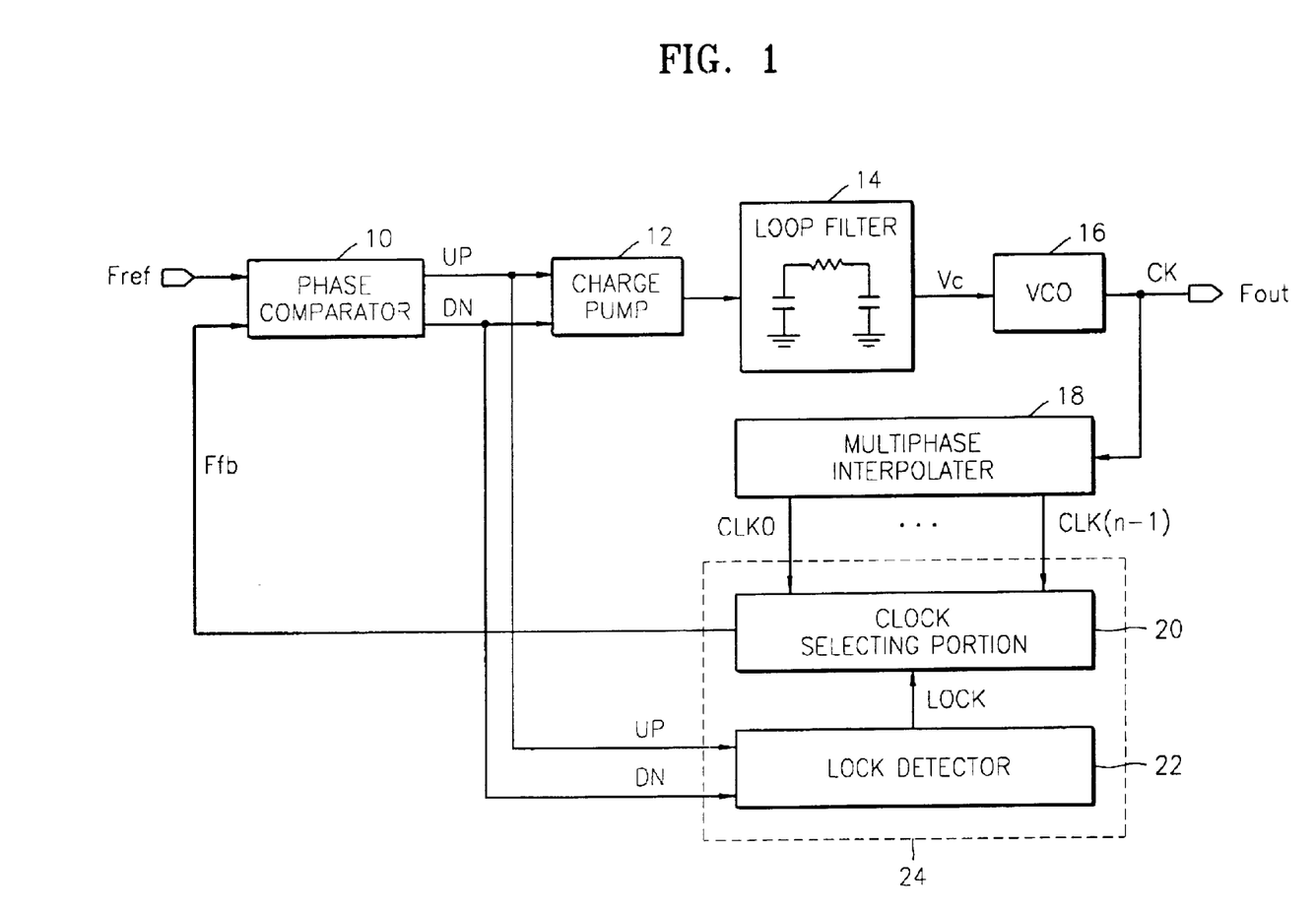
FIG. 1 is a block diagram schematically illustrating a preferred embodiment of a phase locked loop (PLL) for reducing electromagnetic interference (EMI) according to the present invention.

FIG. 1 is a block diagram schematically illustrating a preferred embodiment of a phase locked loop (PLL) for reducing wideband electromagnetic interference (EMI) according to the present invention. The PLL circuit for reducing wideband EMI includes a phase comparator 10, a charge pump 12, a loop filter 14, a voltage-controlled oscillator (VCO) 16, a multiphase interpolater 18, and a feedback clock outputting portion 24.

Referring to FIG. 1, the phase comparator 10 compares the phase of a reference clock signal Fref with the phase of a feedback clock signal Ffb output from the feedback clock outputting portion 24 and outputs the compared result as an up/down signal UP/DN. The charge pump 12 generates a charge signal for supplying charges to the loop filter 14 or sinking charges from the loop filter 14 in response to the up/down signal UP/DN.

The loop filter 14 outputs a voltage corresponding to the charge signal generated in the charge pump 12 as a control voltage to the VCO 16.

The VCO 16 outputs a clock signal CK oscillated at an oscillating frequency corresponding to the control voltage generated in the loop filter 14. As will become clear from the description that follows, the frequency of the clock signal CLK is made to vary, e.g., in a sinusoidal fashion about the reference frequency Fref. This has the effect of reducing EMI produced by harmonic components in the clock signal CLK.

The multiphase interpolater 18 receives the clock signal CK from the VCO 16 and generates first through n-th discrete clock signals CLK0-CLK(n−1) having the same period but shifted in phase by predetermined offsets so as to not to overlap one another. An offset between any two adjacent ones of the shifted clock signals, i.e., CLK(n) and CLK (n+1) corresponds to a width t obtained by dividing one cycle of the clock signal CK by a number n. For simplicity, the first "shifted" clock signal CLK0 can be made to actually have the same phase as that of the clock signal CK.

The feedback clock outputting portion 24 receives the up/down signal UP/DN generated in the phase comparator 10 and determines whether the feedback clock signal Ffb has become locked to the clock signal CK. The feedback clock outputting portion 24 initially outputs, e.g., the first one of the shifted clock signals, CLK0 (having the same phase as that of the clock signal CK), as the feedback clock signal Ffb to the phase comparator 10 until the feedback clock signal Ffb is locked to the reference clock signal Fref. Once the feedback clock signal Ffb is locked to the reference clock signal Fref, the first through n-th shifted clock signals CLK0-CLK(n−1) are sequentially selected in an ascending/descending order (or alternatively a descending/ascending order) to be Ffb, and the selected one of the shifted clock signals is output to the phase comparator 10 as the feedback clock signal Ffb. The feedback clock signal Ffb, when it takes the value of one of the shifted clock signals, can be described as representing an artificial indication of phase difference.

Preferably, the feedback clock outputting portion 24 includes a clock selecting portion 20 and a lock detector 22. The lock detector 22 determines whether the feedback clock signal Ffb is locked to the reference clock signal Fref according to the up/down signal UP/DN output from the phase comparator 10 and outputs the determined result to the clock selecting portion 20 as a lock determining signal LOCK.

The clock selecting portion 20 sequentially selects from among the first through n-th shifted clock signals CLK0-CLK(n−1) in ascending/descending order in response to the lock determining signal LOCK and outputs the selected one of the shifted clock signals to the phase comparator 10 as the feedback clock signal Ffb. If the clock selecting portion 20 selects from among the shifted clock signals according to an ascending order, the first one of the shifted clock signals CLK0 through the n-th one of the shifted clock signals CLKn−1 are sequentially selected. If the clock selecting portion 20 selects from among the clock signals according to a descending order, the n-th one of the shifted clock signals CLK(n−1) through the first one of the shifted clock signals CLK0 are sequentially selected.

Meanwhile, the clock selecting portion 20 alternatively can select some consecutive ones of the shifted clock signals in ascending/descending order (or vice-versa) from a number n of nonoverlapping clock signals in response to the up/down signal UP/DN representing the state of lock.

Figure 2:
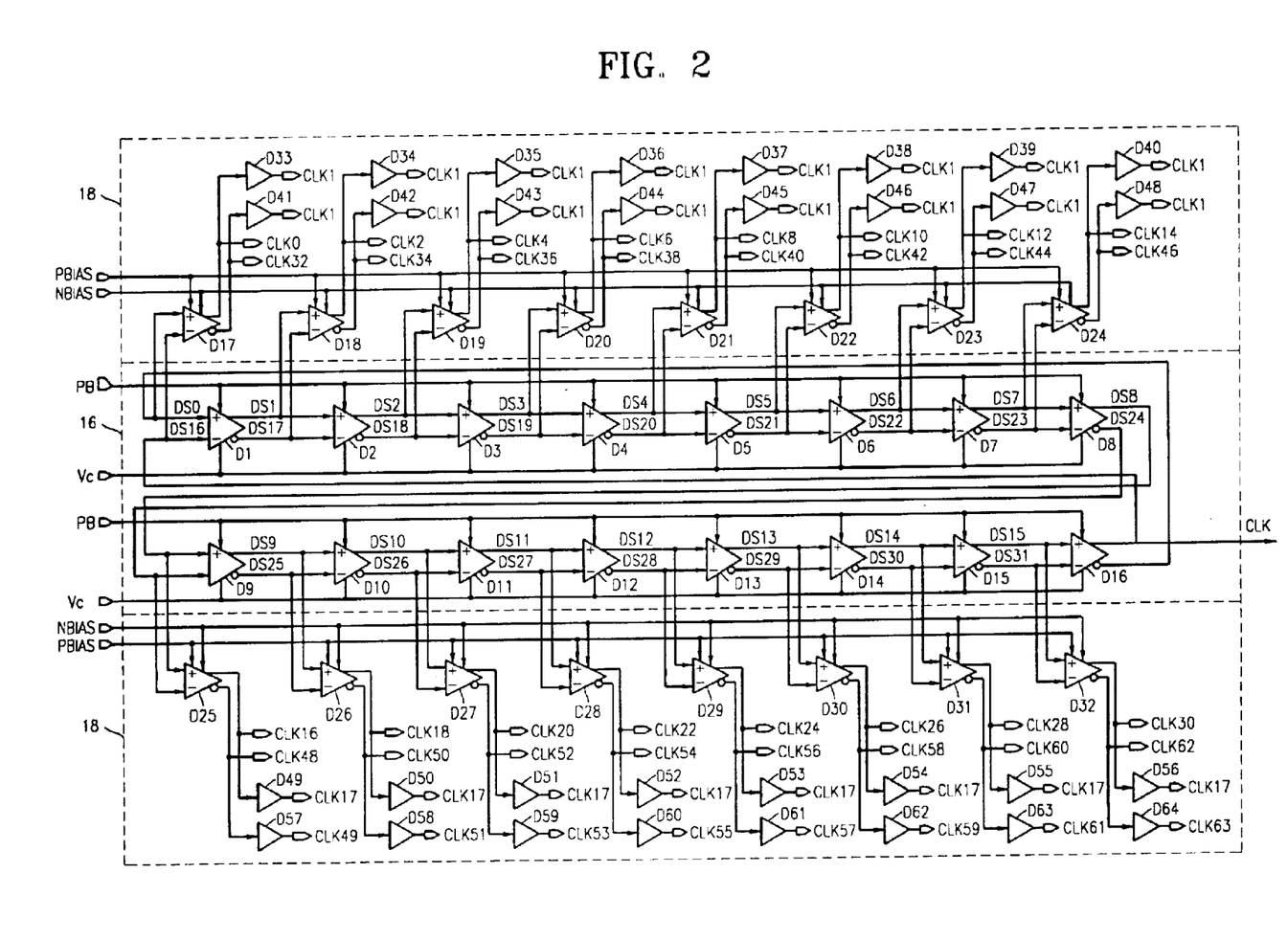
FIG. 2 is a circuit diagram illustrating a preferred embodiment of a multiphase interpolater 18 and a voltage-controlled oscillator (VCO) 16 shown in FIG. 1.

FIG. 2 is a circuit diagram illustrating a preferred embodiment of the multiphase interpolater 18 and the voltage-controlled oscillator (VCO) 16 shown in FIG. 1. The VCO 16 and the multiphase interpolater 18 include a plurality of delay devices D1–D64. For the convenience of explanation, the multiphase interpolater 18 generates first through 64-th shifted clock signals CLK0–CLK63.

Referring to FIG. 2, the VCO 16 is a ring oscillator including sixteen delay devices D1–D16. The delay time of the sixteen delay devices D1–D16 is determined by a control voltage Vc, and the frequency of a clock signal CLK output from the delay device D16 is determined by the delay time. Delayed signals having the predetermined phase offsets as well as inverted versions of the delayed signals are output from each of the sixteen delay devices D1–D16. Thus, first through 32-nd delayed signals DS0–DS31 having predetermined phase offsets are output from the VCO 16 via the delay devices D1–D16.

The first through 32-th delayed signals DS0–DS31 output from the VCO 16 are delayed by the delay devices D17–D64 included within the multiphase interpolater 18, thereby generating the first through 64-th shifted clock signals CLK0–CLK63, as shown in FIG. 2. Each of the delay devices D17–D64 can have the same delay characteristics, and each of the first through 64-th shifted clock signals CLK0–CLK63 can have a predetermined offset so as not to overlap one another.

Figure 3:
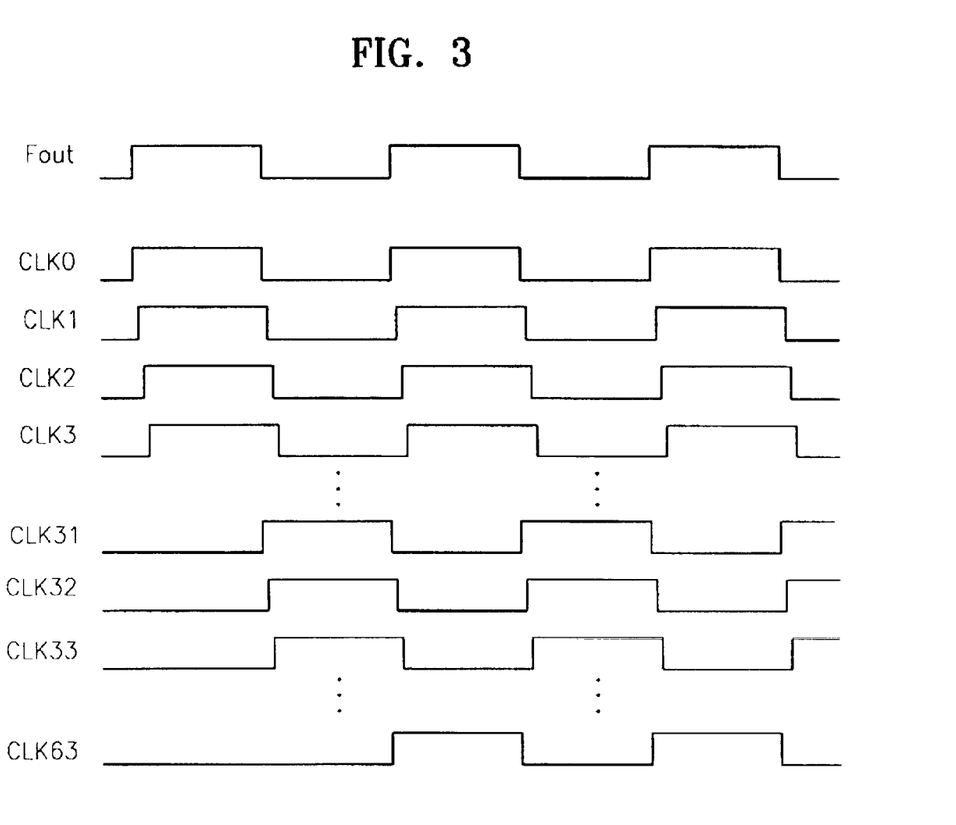
FIG. 3 is a waveform diagram of each of first through 64-th nonoverlapping clock signals CLK0–CLK63, which is output from the multiphase interpolater shown in FIG. 2.

FIG. 3 is a waveform diagram of each of first through 64-th nonoverlapping clock signals CLK0–CLK63, which are output from the multiphase interpolater shown in FIG. 2. Referring to FIG. 3, each of the first through 64-th nonoverlapping clock signals CLK0–CLK63 is delayed by a predetermined offset relative to the preceding clock signal.

Figure 4:
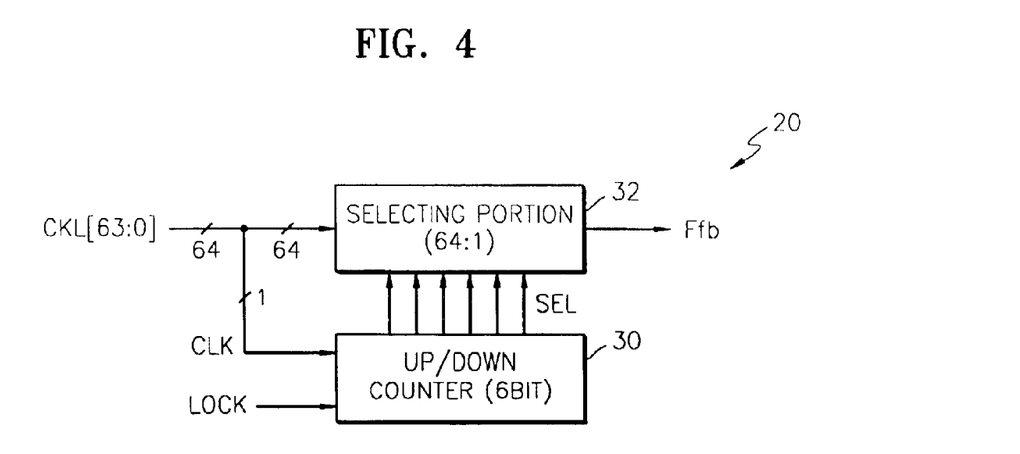
FIG. 4 illustrates a preferred embodiment of a clock selecting portion 20 shown in FIG. 1.

FIG. 4 illustrates a preferred embodiment of a clock selecting portion 20 shown in FIG. 1. The clock selecting portion 20 includes an up/down counter 30 and a selecting portion 32. For the convenience of explanation, the up/down counter 30 is a 6-bit up/down counter; other counter sizes can be used.

FIGS. 5A–5F are diagrams illustrating input/output signals of the clock selecting portion 20 shown in FIG. 4. FIGS. 5A through 5D depict ones of the shifted clock signals, FIG. 5E denotes a selected one of the shifted clock signals that is input to the up/down counter 30, and FIG. 5F denotes a feedback clock signal Ffb output from the selecting portion 32.

Figure 5A:
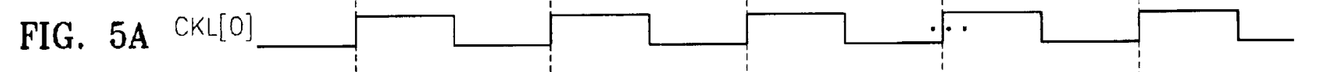
FIGS. 5A–5F are diagrams illustrating input/output signals of the clock selecting portion 20 shown in FIG. 4.
Figure 5B:
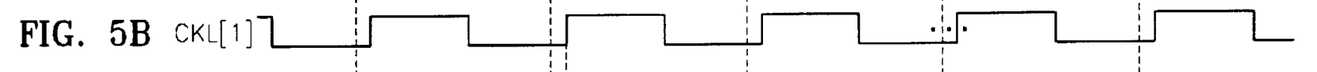
Figure 5C:
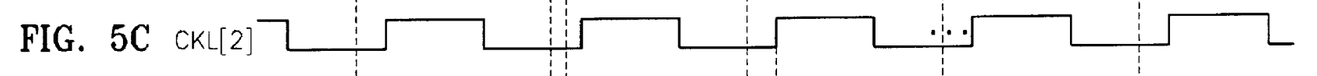
Figure 5D:
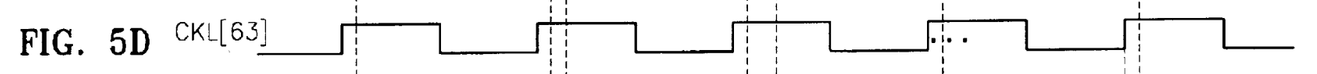
Figure 5E:
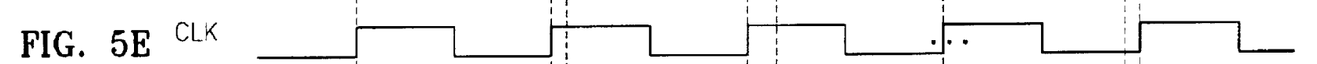

Referring to FIGS. 4 and 5, the up/down counter 30 is a 6-bit counter that starts counting the selected one of the shifted clock signals shown in FIG. 5E in response to the lock determining signal LOCK shown in FIG. 1 and outputs the counted result to the selecting portion 32 as a 6-bit selection signal SEL. The particular shifted clock signal input to the up/down counter 30 can be selected from any one of the first through 64-th shifted clock signals CLK0--CLK63. In the example of FIG. 5E, the first one of the shifted clock signals CLK0 has been selected to be counted. Thus, the 6-bit up/down counter 30 up-counts from 0 to 63 sequentially in response to the lock determining signal LOCK and then down-counts from 63 to 0.

The selecting portion 32 selects one signal from the first through 64-th shifted clock signals CLK0–CLK63 input from the multiphase interpolater 18 in response to the 6-bit selection signal SEL received from the up/down counter 30 and outputs the signal as the feedback clock signal Ffb. That is, the selecting portion 32 sequentially selects and outputs the first through 64-th shifted clock signals CLK0–CLK63, and then reverses the selection order to sequentially select and output one from the 64-th through first shifted clock signals CLK63–CLK0, in response to the counted result of the up/down counter 30.

Figure 5F:
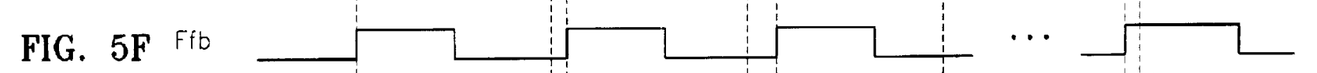

Thus, the selecting portion 32, as shown in FIG. 5F, selects and outputs the first shifted clock signal CLK0 at an interval T1 corresponding to a count of 0 by the up/down counter 30, the second shifted clock signal CLK1 at an interval T2 corresponding to a count of 1, and the third shifted clock signal CLK 2 at an interval T3 corresponding to a count of 2, etc.

The selecting portion 32 selects and outputs the 64-th shifted clock signal CLK63 at an interval T64 corresponding to a count of 63 by the up/down counter 30.

Alternatively, for example, the up/down counter 30 could be a 5-bit counter whose initial value could be set to 16, and that could up/down-count 16-47/47-16 in response to the lock determining signal LOCK. The selecting portion 32 would sequentially select and output the 16-th through 47-th shifted clock signals CLK15–CLK46 and then reverse going CLK46 to CLK 15.

Figure 6:
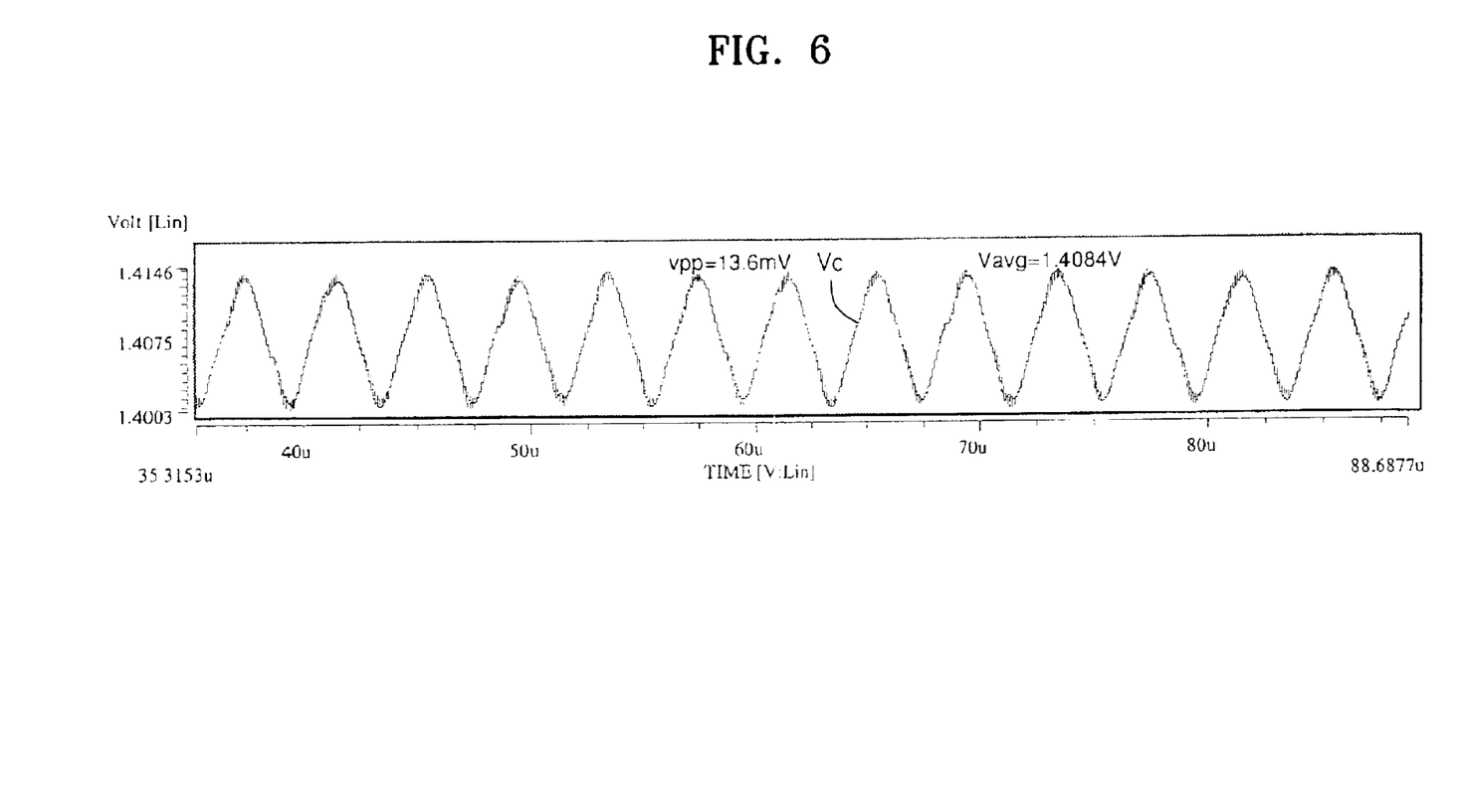
FIG. 6 is a waveform diagram illustrating a control voltage Vc, which is generated in a loop filter 14, after the PLL circuit shown in FIG. 1 is locked.

FIG. 6 is a waveform diagram illustrating an example of a control voltage Vc, which is generated in a loop filter 14 after the PLL circuit shown in FIG. 1 is locked. It can be seen in FIG. 6 that the control voltage Vc is periodically increased and decreased. In other words, the control voltage can be described as a sinusoidal waveform superimposed on a constant voltage, where the magnitude of variation in the sinusoid is much smaller but not negligible. In the example of FIG. 6, the magnitude of Vc varies by about 1%. Once the PLL circuit shown in FIG. 1 is locked (i.e., Ffb is locked to Fref), the feedback clock signal outputting portion 24 sequentially selects the first through 64-th nonoverlapping clock signals CLK0–CLK63 in ascending/descending order and outputs them as the feedback clock signal Ffb. As a result, a phase difference between the reference clock signal Fref and the feedback clock signal Ffb occurs, and the control voltage Vc is varied in accordance with the phase difference.

While the feedback clock signal outputting portion 24 sequentially generates the first through 64-th nonoverlapping clock signals CLK0–CLK63, the phase difference between the reference clock signal Fref and the feedback clock signal Ffb is increased, thereby increasing the control voltage Vc generated in the loop filter 14. On the other hand, while the feedback clock signal outputting portion 24 sequentially generates the 64-th through first nonoverlapping clock signals CLK63–CLK0, the phase difference between the reference clock signal Fref and the feedback clock signal Ffb is decreased, thereby decreasing the control voltage Vc generated in the loop filter 14. Thus, the control voltage Vc generated in the loop filter 14 takes on the appearance of a sine wave, as shown in FIG. 6. Modulation occurs in the clock signal CK generated in the VCO 16 due to the modulation of the control voltage Vc, and as a consequence, electromagnetic interference (EMI) generated in the clock signal CK is reduced.

Figure 7:
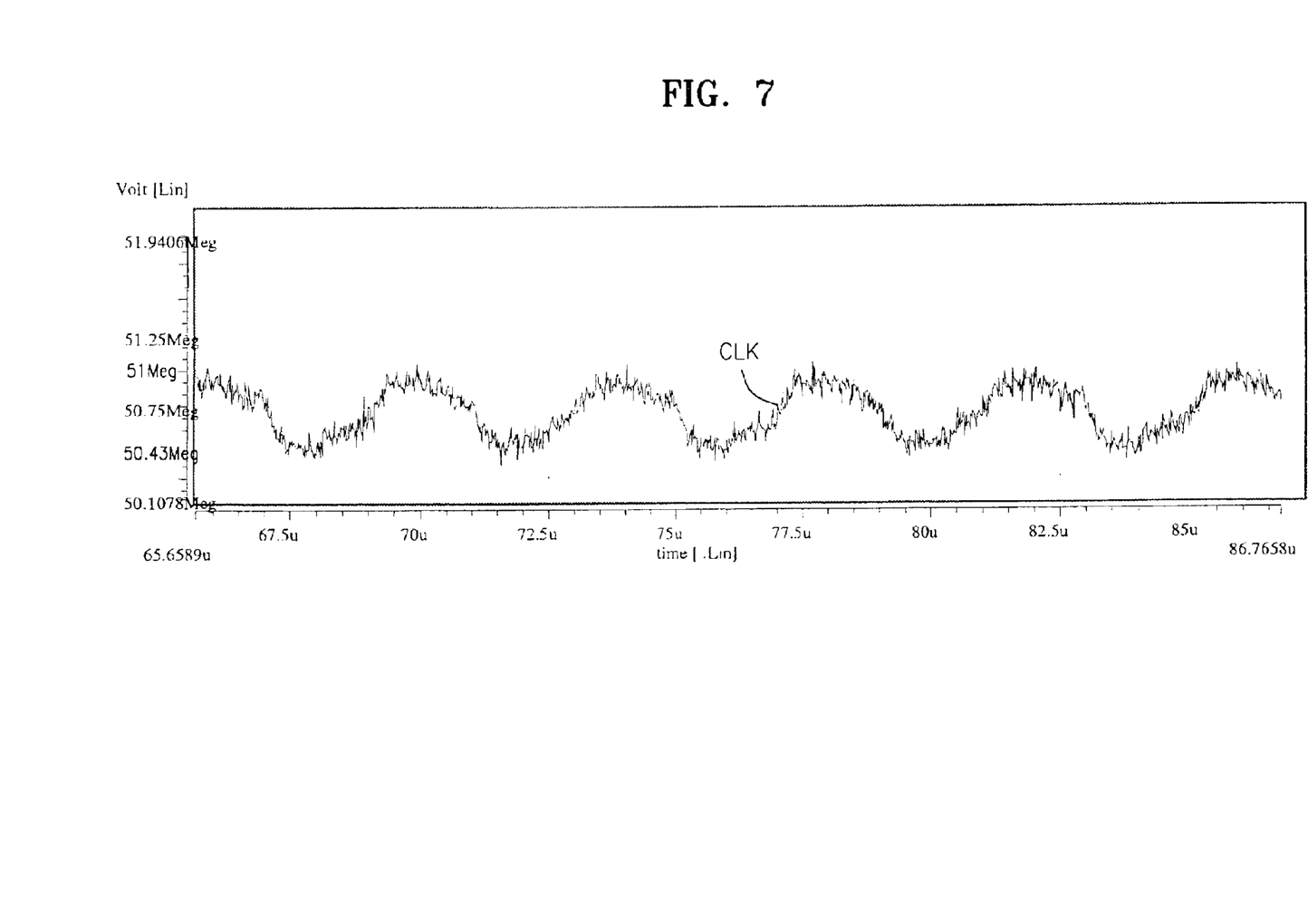
FIG. 7 illustrates that the frequency of a clock signal CK output from the VCO 16 shown in FIG. 1 is modulated according to the control voltage Vc shown in FIG. 6.

FIG. 7 illustrates an example of the clock signal CK in which the frequency of the clock signal CK output from the VCO 16 shown in FIG. 1 is modulated according to the example control voltage Vc shown in FIG. 6. Referring to FIG. 7, the clock signal CK, as output from the VCO 16 is not output as the clock signal CK having a frequency locked to the reference clock signal Fref, but is output as a frequency modulated clock signal whose frequency varies slightly but not negligibly, in a sinusoidal fashion around the reference frequency F ref. in response to the control voltage Vc shown in FIG. 6 (after the PLL circuit is locked). In FIG. 7, the variation in frequency of the clock signal CLK is about 1.1%.

Figure 8A:
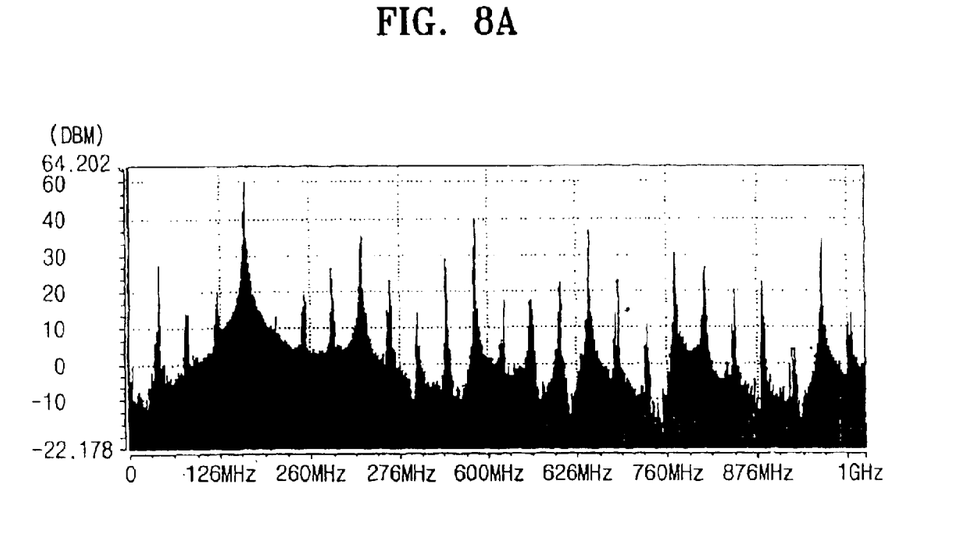
FIGS. 8A and 8B are graphs illustrating the effect that electromagnetic interference (EMI) of the PLL circuit shown in FIG. 1 is reduced.
Figure 8B:
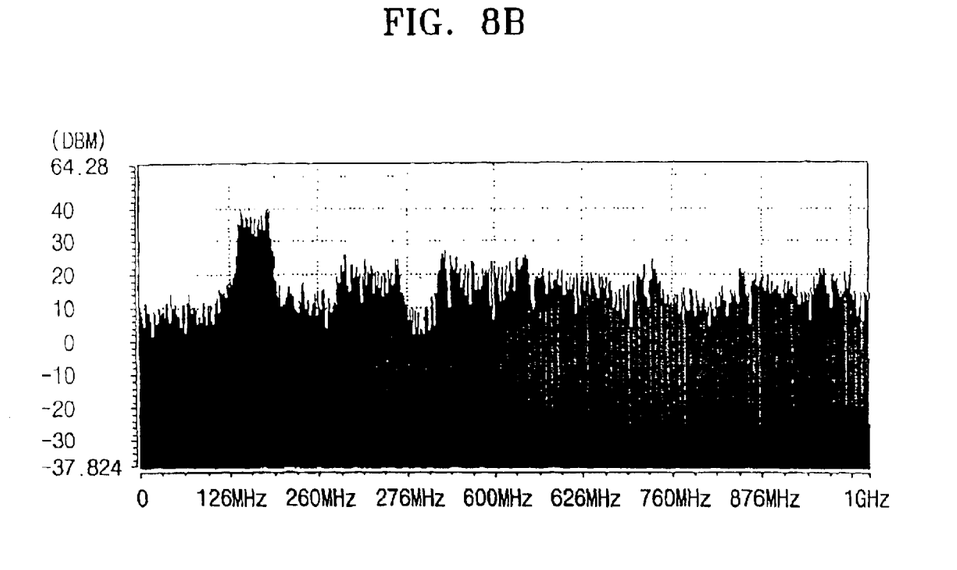

FIGS. 8A and 8B together are graphs illustrating the effect of having reduced the electromagnetic interference (EMI) caused by a PLL circuit. FIG. 8A illustrates the energy level of EMI generated in the clock signal output from a Background Art PLL circuit. The PLL circuit according to the Background Art (FIG. 9) does not include the multiphase interpolater 18 and the clock selecting portion 20 as shown in FIG. 1, but has a configuration in which the clock signal CK generated in the VCO 16 is directly input to the phase comparator 10. FIG. 8B illustrates the energy level of EMI generated in an example clock signal output from the PLL circuit shown in FIG. 1. Also, for the convenience of explanation, the PLL circuit shown in FIG. 1 generates a 160 MHz clock signal; other frequencies can be selected. In the graphs shown in FIGS. 8A and 8B, an absolute value with respect to the energy of EMI generated in the clock signal output from the PLL circuit is respectively obtained, and then, the absolute value is indicated in decibels ('DBM').

Referring to FIG. 8A, a large amount of white noise over all frequencies is contained in the clock signal output from the conventional PLL circuit. At present, according to the stipulation of EMI by the Federal Communication Commission (FCC) of the United States, the energy level of EMI generated in televisions (TVs), computers, and mobile phones are limited to less than 47 DBM. According to the stipulation, the PLL circuit for generating output shown in FIG. 8A does not meet the stipulation of the FCC (e.g., one peak reaches 60 DBM).

However, referring to FIG. 8B, most of the white noise over all frequencies has been removed. That is, the PLL circuit shown in FIG. 1 satisfies the stipulation of the FCC because no peak exceeds 47 DBM, moreover none exceeds 40 DBM. As described above, the PLL circuit according to an embodiment of the present invention can generate a feedback clock signal for modulating the control voltage of the VCO 16 by using the multiphase interpolater 18 and the feedback clock signal outputting portion 24, which both of which can be implemented with a simple circuit, thereby reducing EMI existing in the clock signal CK output by the VCO 16. The PLL circuit can effectively reduce the energy in a range of frequencies which can be manifested as wideband electromagnetic interference (EMI), as well as the energy of a certain frequency.

While this invention has been particularly shown and described with reference to preferred embodiments thereof, it will be understood by those skilled in the art that various changes in form and details may be made therein without departing from the spirit and scope of the invention as defined by the appended claims.

What is claimed is:

1. A phase locked loop (PLL) circuit for reducing electromagnetic interference (EMI) including a phase comparator for comparing the phase of an externally input reference clock signal with the phase of a feedback signal to output an up or a down signal according to the compared result, a charge pump for generating a charge signal for supplying or sinking charges in response to the up or down signal, and a loop filter for low-pass filtering the charge signal to generate direct current (DC) control voltage, the PLL circuit comprising:

a voltage-controlled oscillator (VCO) for generating an output clock signal oscillated into an oscillating frequency corresponding to the control voltage;

a multiphase interpolater for generating first through n-th shifted signals, which have a predetermined offset so as not to overlap one another, by using the output clock signal; and a feedback signal portion for receiving the up/down signal to determine whether the feedback signal is locked to the reference clock signal, for outputting the output clock signal as the feedback clock signal before the feedback signal is locked to the reference clock signal, and for sequentially selecting one of the first through n-th shifted clock signals to be the feedback clock signal once the feedback clock signal is locked to the reference clock signal.

2. The PLL circuit as claimed in claim 1, wherein the feedback signal portion comprises:

a lock detector for inputting the up/down signal to determine whether the feedback signal is locked to the reference clock signal and outputting the determined result as a lock determining signal; and a clock selecting portion for outputting the output clock signal as the feedback signal in response to the lock determining signal, or sequentially selecting one of the first through n-th shifted clock signals in one of an ascending order or a descending order to output the first through n-th shifted clock signals as the feedback clock signal.

3. The PLL circuit as claimed in claim 1, wherein the clock selecting portion comprises:

an up/down counter for selectively outputting a predetermined counter value as a selection signal or up/down-counting the output clock signal to output the counted result as the selection signal in response to the clock determining signal; and a selecting portion for selectively outputting one of the first through n-th shifted clock signals according to the selection signal as the feedback signal; and wherein the predetermined counter value corresponds to the one from among the first through n-th shifted clock signals having the same phase as that of the output clock signal.

4. The PLL circuit as claimed in claim 3, wherein the up/down counter generates the selection signal so that the selecting portion selects some consecutive ones from the first through n-th shifted clock signals.

5. A method of controlling a phase locked loop (PLL) circuit for reducing electromagnetic interference (EMI) including a phase comparator for comparing the phase of an externally input reference clock signal with the phase of a feedback signal to output an up or a down signal according to the compared result, a charge pump for generating a charge signal for supplying or sinking charges in response to the up or down signal, a loop filter for low-pass filtering the charge signal to generate direct current (DC) control voltage, and a voltage-controlled oscillator (VCO) for generating an output clock signal having an oscillating frequency corresponding to the control voltage, the method comprising:

(a) generating first through n-th shifted clock signals, which have a predetermined offset so as not to overlap one another, by using the clock signal;

(b) determining, according to the up/down count, whether the phase locked loop (PLL) circuit is locked;

(c) selecting one of said shifted clock signals having the same phase as that of the clock signal and providing the selected signal to the phase comparator until it is determined that the PLL circuit is locked in the step (b); and (d) sequentially selecting one from among the first through n-th shifted clock signals to be the feedback signal once it is determined that the PLL circuit is locked in the step (b).

6. The method as claimed in claim 5, wherein the step (d) comprises the steps of:

(d1) up/down-counting the clock signal once it is determined that the PLL circuit is locked in the step (b); and (d2) selecting one from among the first through n-th shifted clock signals according to the result counted in the step (d1) to be the feedback signal.

7. The method as claimed in claim 6, wherein some consecutive ones of the shifted clock signals are sequentially selected according to one of the orderings from among the first through n-th shifted clock signals and output as the feedback signal according to the result counted in the step (d1), in the step (d2).

8. In a phase-locked loop, a method of reducing electromagnetic interference caused by a clock signal produced by a voltage controlled oscillator, the method comprising:

generating a control signal having a first periodically increasing and decreasing pattern of slight variation in magnitude relative to a nominal magnitude value thereof;

providing the slightly varying control signal to a voltage-controlled oscillator ("VCO"); and manipulating an output of the VCO to obtain a clock signal exhibiting a second periodically increasing and decreasing pattern of slight variation in frequency relative to a nominal frequency value thereof.

9. In a phase-locked loop, a method of reducing electromagnetic interference caused by a clock signal produced by a voltage controlled oscillator, the method comprising:

generating a control signal having a first type of slight variation in magnitude relative to a nominal magnitude value thereof;

providing the slightly varying control signal to a voltage-controlled oscillator and ("VCO"); and manipulating an output of the VCO to obtain a clock signal exhibiting a second type of slight variation in frequency relative to a nominal frequency value thereof;

said step of generating said control signal including
locking the clock signal of said VCO to a reference signal such that said clock signal exhibits at least substantially no variation in phase therefrom,
determining when said clock signal is locked to said reference frequency,
providing, once said clock signal and said reference frequency are determined to be locked, an indication of an artificial difference, the indication varying in a substantially sinusoidal fashion around a nominal difference in phase, and
determining said control signal according to the indication such that said control signal exhibits said sinusoidal variation.

10. The method of claim 9, wherein said nominal difference in phase is zero.

11. The method of claim 9, wherein the step of providing an indication of a phase difference includes:

generating a plurality of faux clock signals having substantially the same period as said reference signal but each of which is shifted by a different predetermined amount of phase relative to said reference signal;

sequentially selecting from among said plurality faux clock signals according to a predetermined order of progression; and comparing a phase difference between the selected signal and said reference signal;

wherein said indication is based upon the result of said step of comparing, said indication varying according to a difference in phase between the selected faux clock signal and the reference signal.

12. In a phase-locked loop, an apparatus for reducing electromagnetic interference caused by a clock signal produced by a voltage controlled oscillator, the apparatus comprising:

generating means for generating a control signal having a first periodically increasing and decreasing pattern of slight variation in magnitude relative to a nominal magnitude value thereof; and voltage-controlled oscillator ("VCO") means for generating a clock signal exhibiting a second periodically increasing and decreasing pattern of slight variation in frequency relative to a nominal frequency value thereof based upon the slightly varying control signal output by said generating means.

13. In a phase-locked loop, an apparatus for reducing electromagnetic interference caused by a clock signal produced by a voltage controlled oscillator, the apparatus comprising:

generating means for generating a control signal having a first type of slight variation in magnitude relative to a nominal magnitude value thereof; and voltage-controlled oscillator ("VCO") means for generating a clock signal exhibiting a second type of slight ringing variation in frequency relative to a nominal frequency value thereof based upon the slightly ringing varying control signal output by said generating means;

said VCO means includes locking means for locking the clock signal of said VCO to a reference signal such that said clock signal exhibits at least substantially no variation in phase therefrom; and said generating means includes
comparing means for determining when said clock signal is locked to said reference frequency and
variation means for providing, once comparing means has determined said clock signal and said reference frequency to be locked, an indication of an artificial difference, the indication being of a difference between said clock signal and said reference frequency, a magnitude of said indication varying in a substantially sinusoidal fashion around a nominal difference in phase,
wherein said locking means is operable to determine said control signal according to said indication such that said control signal exhibits slight sinusoidal variation.

14. The apparatus of claim 13, wherein said nominal difference in phase is zero.

15. The apparatus of claim 13, wherein said variation means includes:

faux means for generating a plurality of faux clock signals having substantially the same period as said reference signal but each of which is shifted by a different predetermined amount of phase relative to said reference signal; and selection means for sequentially selecting from among said plurality faux clock signals according to a predetermined order of progression;

wherein said comparison means is operable to compare a phase difference between the selected signal and said reference signal; and wherein said indication is based upon the output of said comparison means, said indication varying according to a difference in phase between the selected faux clock signal and the reference signal.

16. The method of claim 8, wherein at least the first pattern is sinusoidal.

17. The method of claim 16, wherein the first pattern is a saw-tooth-like sinusoidal pattern.

18. The method of claim 16, wherein:

a magnitude of peak-to-peak variation in the sinusoidal first pattern is substantially smaller than the nominal magnitude of the control signal.

19. The method of claim 18, wherein the nominal magnitude is substantially constant.

20. The apparatus of claim 12, wherein at least the first pattern is sinusoidal.

21. The apparatus of claim 20, wherein the first pattern is a saw-tooth-like sinusoidal pattern.

22. The apparatus of claim 20, wherein:

a magnitude of peak-to-peak variation in the sinusoidal first pattern is substantially smaller than the nominal magnitude of the control signal.

23. The apparatus of claim 22, wherein the nominal magnitude is substantially constant.

* * * * *